United States Patent [19]

Hutson

[11] 3,972,014

[45] July 27, 1976

[54] FOUR QUADRANT SYMMETRICAL SEMICONDUCTOR SWITCH

[76] Inventor: Jearld L. Hutson, 2019 W. Valley View Lane, Dallas, Tex. 75234

[22] Filed: Nov. 11, 1974

[21] Appl. No.: 522,603

[52] U.S. Cl. ................................. 357/39; 357/20; 357/49; 357/55
[51] Int. Cl.² ..................................... H01L 29/747
[58] Field of Search .................. 357/39, 55, 20, 48, 357/49, 45

[56] References Cited
UNITED STATES PATENTS

| | | | |
|---|---|---|---|
| 3,123,750 | 3/1964 | Hutson et al. | 357/39 |
| 3,280,386 | 10/1966 | Philips | 357/39 |
| 3,360,696 | 12/1967 | Neilson et al. | 357/39 |
| 3,443,171 | 5/1969 | Knott et al. | 357/39 |
| 3,504,241 | 3/1970 | Dumanevich et al. | 357/39 |
| 3,622,841 | 11/1971 | Zoroblu | 357/39 |
| 3,673,468 | 6/1972 | Schafer | 357/55 |
| 3,787,719 | 1/1974 | Anderson | 357/39 |

*Primary Examiner*—Michael J. Lynch
*Assistant Examiner*—Joseph E. Clawson, Jr.
*Attorney, Agent, or Firm*—Richards, Harris and Medlock

[57] ABSTRACT

A semiconductor switching device is disclosed which has symmetrical operating characteristics in four quadrants, and which is characterized by the substantial elimination of lateral switching currents. In the preferred embodiments, symmetrical semiconductor switching devices are disclosed having five and seven interleaved layers of opposite semiconductor conductivity types. A lower surface of each device is dissected into two areas by a linear groove extending through the outer semiconductor layers to separate apart and electrically isolate one area from the other, while an upper surface is dissected by a groove separating and electrically isolating opposing regions of opposite conductivity types which are formed in the upper surface and which overlap the projected path of the bottom groove. Electrodes in contact with the opposing regions are connected in parallel to a gate or control terminal, while electrodes in contact with the upper surface and with a region of opposite conductivity type formed into the upper surface are connected in parallel to a first anode terminal. A second anode terminal is formed from electrodes in contact with the two areas of the lower surface.

23 Claims, 11 Drawing Figures

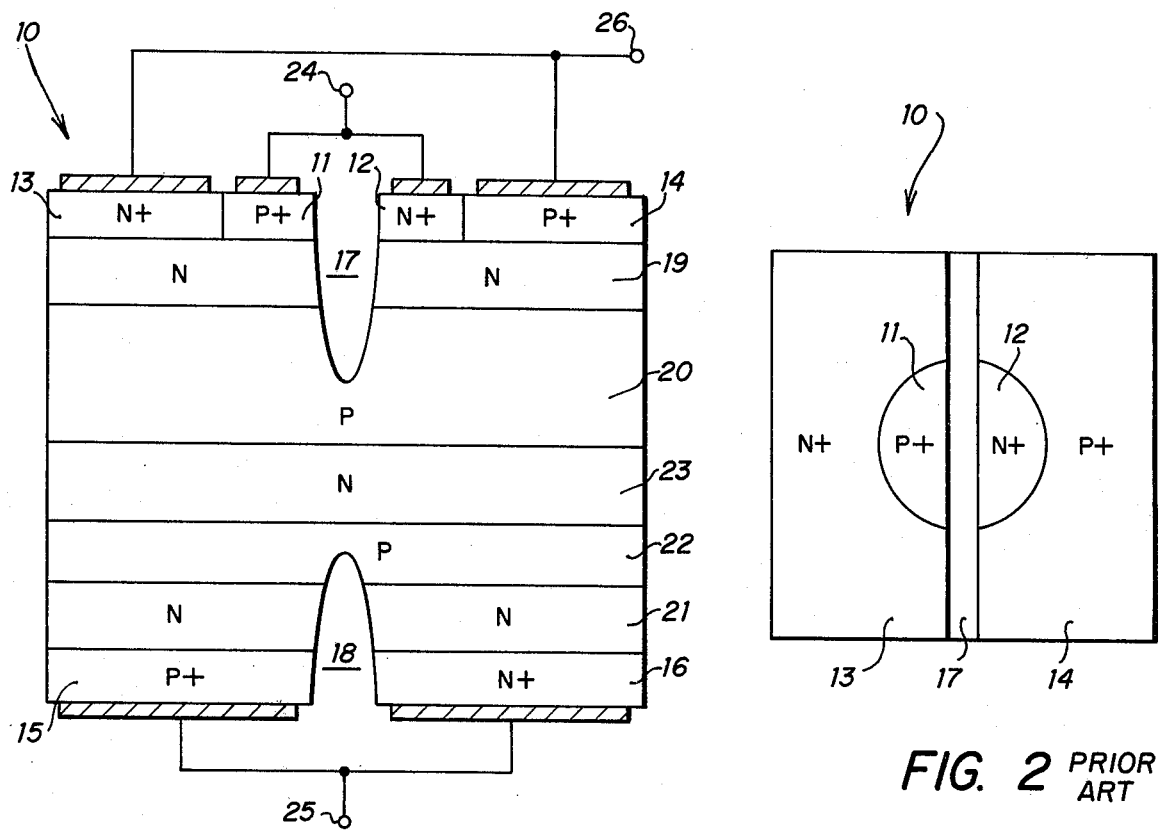
FIG. 1 PRIOR ART
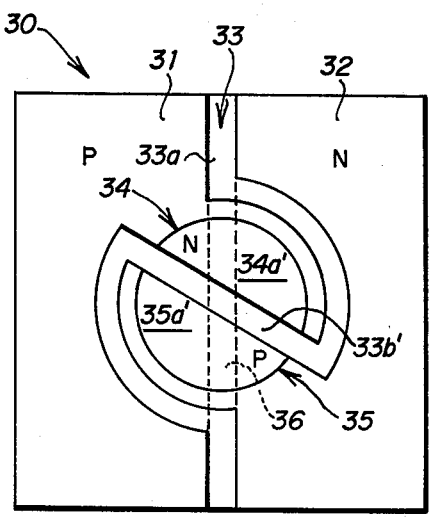
FIG. 2 PRIOR ART
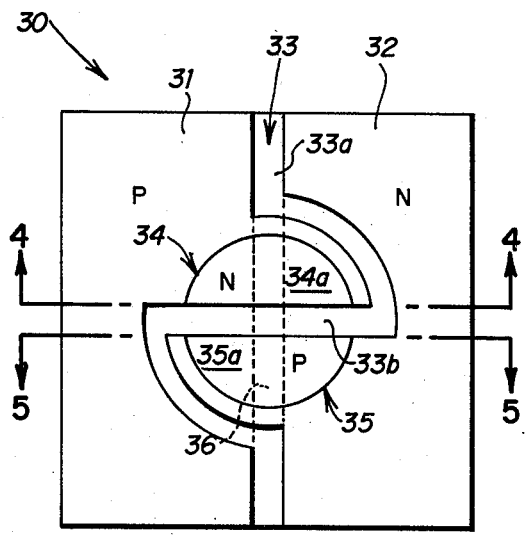
FIG. 3a
FIG. 3b 3,972,014

FOUR QUADRANT SYMMETRICAL SEMICONDUCTOR SWITCH

CROSS REFERENCE

This application discloses an improvement over the invention of applicant's copending application Ser. No. 488,789, Filed July 15, 1974, and entitled "MULTI-LAYER SEMICONDUCTOR SWITCHING DEVICES."

FIELD OF THE INVENTION

This invention relates to multilayer semiconductor devices, and more particularly relates to semiconductor symmetrical switching devices having selected operating characteristics in four quadrants.

PRIOR ART

Semiconductor switching operations requiring bilateral current flow heretofore have generally been performed by symmetrical triac devices comprising five layers of alternating semiconductor conductivity types. Four of the layers of such devices have been utilized for switching or conducting during one half cycle of an AC voltage source, and three of the same layers and a fifth layer have been used for conducting during the second half cycle of the voltage source.

A description of the construction and operation of such five layer semiconductor devices may be found in U.S. Pat. Nos. s8c 3,275,909 issued Sept. 27, 1966; U.S. Pat. No. 3,60,696 issued Dec. 26, 1967; U.S Pat. No. 3,476,993 issued Nov. 4, 1969; and U.S. Pat. No. 3,317,746 and U.S. Pat. No. 3,475,666 issued to the present applicant on May 2, 1967, and Oct. 28, 1969, respectively A significant improvement to the prior art devices is disclosed in applicant's before referenced application Ser. No. 488,789, wherein multilayer semiconductor switching devices are disclosed having grooves extending through outer semiconductor layers to provide physical and electrical isolation. The benefits derived from such a construction include increased voltage capacity and high temperature stability, improved commutating and static dV/dt characteristics, and substantial reduction in lateral switching currents which tend to reduce the switching sensitivity. None of the prior devices, however, provide these improved characteristics in four quadrants of gating operation as defined by an output current versus applied voltage (I–V) graph.

The present invention provides a symmetrical semiconductor switching device having the improved operational characteristics as disclosed in copending application Ser. No. 488,789, and further having reliable performance in any desired combination of the four I–V quadrants.

SUMMARY OF THE INVENTION

The present invention is directed to a semiconductor switching device having substantially eliminated lateral switching currents and symmetrical performance characteristics in four quadrants of operation.

More particularly, a multilayered semiconductor body of alternating conductivity types is provided which includes a lower surface dissected by a linear groove physically and electrically isolating electrodes forming an anode of the device, and an upper surface dissected by a groove configured to physically and electrically isolate not only the electrodes forming a second anode, but also portions of semiconductor regions overlapping a projected path of the lower surface groove and in contact with electrodes forming a gate or control terminal of the switching device.

In the preferred embodiments, symmetrical switching devices operable in four quadrants are formed from five and seven semiconductor layers of alternating conductivity types, with an upper surface of the device penetrated by a groove having end segments parallel to and an intermediate segment perpendicular to an upward projection of the lower surface groove.

DESCRIPTION OF THE DRAWINGS

For a more complete understanding of the present invention and for further objects and advantages thereof, reference is now made to the following description taken in conjunction with the accompanying drawings, in which:

FIG. 1 is a diagrammatic sectional view of a seven layer switching device operable in the first and third quadrants only;

FIG. 2 is a top diagrammatic illustration of the switching device of FIG. 1;

FIG. 3a is a top diagrammatic illustration of a five layer semiconductor switching device embodying the invention;

FIG. 3b is a top diagrammatic illustration of a modification to the device of FIG. 3A to provide a more favorable operation in the second and fourth quadrants at the expense of operation in the first and third quadrants;

FIG. 4 is a diagrammatic sectional view of the switching device of FIG. 3a taken along lines 4—4 of FIG. 3a;

FIG. 5 is a diagrammatic sectional view of the switching device of FIG. 3a taken along lines 5—5 of FIG. 3a;

DESCRIPTION OF PREFERRED EMBODIMENTS

Figure 4:
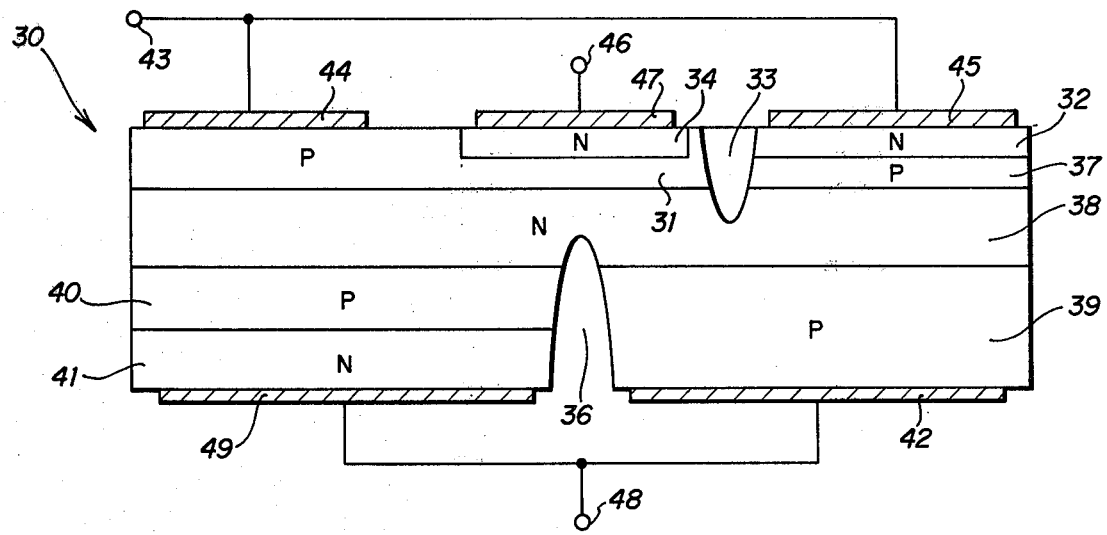

To more fully understand the nature of the improvement herein described, reference is made to a switching device disclosed in the before referenced and copending application Ser. No. 488,789.

More particularly, as illustrated in FIG. 1, the switching device comprises a semiconductor body 10 having five intermediate layers 19–23 of alternating conductivity types. Two regions 11 and 14 of heavily doped P+ material, two regions 12 and 13 of heavily doped N+ material are diffused into the outer surface of an N-type layer 19. A groove 17 extending through layer 19 and into P-type layer 20 isolates regions 11 and 13 from regions 12 and 14.

Diffused into the outer surface of an N-type layer 21 is a region 15 of heavily doped P+ materal and a region 16 of heavily doped N+ material. A second groove 18, physically and elctrically isolating region 15 from region 16, extends through an N-type layer 21 and into a P-type layer 22.

A gate or control terminal 24 is connected to an electrode formed in contact with region 11 and to an electrode in contact with region 12, while an anode terminal 26 is connected to an electrode formed in contact with region 13 and to an electrode formed in contact with region 14. A second anode terminal 25 is connected to an electrode in contact with region 15 and to an electrode in contact with region 16.

From a top view of semiconductor body 10 as illustrated in FIG. 2, it may be seen that the device is geometrically symmetrical. The P+ region 11 and N+ region 12 each comprises one half of a circle, and the groove 17 extends completely across the entire body 10 to isolate the N+ region 13 from the P+ region 14.

In operation, the switching device of FIGS. 1 and 2 functions as a bilateral switch obviating any requirement for electrodes shorting across PN junctions, and substantially eliminates lateral switching currents generated during the operation of the device. However, the device effectively is limited to operation in the first and third I-V quadrants.

In accordance with the invention, as illustrated in FIG. 3a, a symmetrical switching device is provided which comprises a semiconductor body 30 having a P-type region 31 isolated from an N-type region 32 by a groove 33. Groove 33 extends through the outer surface of the body and additionally isolates a semicicular N-type region 34 adjacent to region 31 from a semicircular P-type region 35 adjacent to region 32.

A groove 36 indicated by dotted lines in FIG. 3a extends through and separates the lower surface of body 30 into two physically and electrically isolated areas.

It has been found that by rotating the N and P semicircular regions 34 and 35 90° with respect to the configuration of regions 11 and 12 as shown in FIG. 2, a semiconductor switching device having symmetrical operational characteristics in four rather than two quadrants of operation may be provided. In this configuration, N-type region 34 and P-type region 35 have equal overlap areas 34a and 35a, respectively, extending on either side of a projected image of groove 36. However, where regions 34 and 35 are so oriented that groove segment 33b forms less than a 90° degree angle with groove segment 33a, the operational characteristics in quadrants 2 and 4 are inferior to those in quadrants 1 and 3. Further, where regions 34 and 35 are rotated clockwise as illustrated in FIG. 3b to form an angle between segments 33b° and 33a of magnitude greater than 90°, operation in quadrants 2 and 4 becomes superior. As may be seen from a comparison of the figures, the overlap areas 34A' and 35a' of FIG. 3b are larger than overlap areas 34a and 35a of FIG. 3a.

Therefore, in accordance with the invention, the sensitivity of a switching device may be selectively varied by increasing or decreasing the area of the upper surface anode electrode semiconductor regions, for example regions 34a and 35a of FIG. 3a, that overlap and extend across the projected path of the lower surface groove. It will be understood that this inventive concept is applicable to five layer, seven layer, and greater layered symmetrical switch devices.

FIG. 4 is a sectional view of the switching device illustrated in FIG. 3a, and includes five semiconductor layers of alternating conductivity types. Specifically, the upper surface of a center layer 38 has diffused therein an outer P-type region 31, and an intermediate P-type region 37. Adjacent to P-type regions 31 and 37 are N-type regions 34 and 32, respectively. Regions 31 and 34 are physically separated and electrically isolated from regions 32 and 37 by groove 33.

Diffused to the opposite surface of center layer 38 is an intermediate P-type region 40 and an outer P-type region 39. Adjacent to region 40 is an outer N-type region 41. Regions 40 and 41 are electrically and physically isolated from P-type region 39 by groove 36.

An anode terminal 43 is in electrical communication with both an electrode 44 formed in contact with region 31, and an electrode 45 in contact with region 32. In addition, a control signal terminal 46 is connected to an electrode 47 in contact with regions 34 and 35, and a second anode terminal 48 is connected to electrodes 49 and 42 in contact with regions 41 and 39, respectively.

When a positive voltage is applied to terminal 43 and a voltage more negative than that applied to terminal 46 is applied to terminal 48, quadrant three operation ensues and juctions between regions 32 and 37, and between layer 38 and regions 39 and 40 are reverse biased to form blocking junctions. The slightly negative voltage applied to terminal 46 causes region 34 to inject electrons into P-type region 31. The injected electrons diffuse toward the PN junction between region 31 and layer 38, where the space charge layer is sufficient for the collection of minority carriers. The injected electrons that are collected lower the potential of layer 38 with respect to P-type region 31, and cause P-type mobile carriers or holes to be injected from region 31 into layer 38. The injected holes diffuse toward the blocked junction between layer 38 and regions 39 and 40, and those collected at the junction with P-type region 40 raise the potential of the region relative to N-type region 41. This difference in potential tends to cause the injection of electrons from region 41 into region 40, where they diffuse toward the blocked junction with layer 38. Those electrons collected lower the potential of layer 38 relative to P-type region 31, thereby causing further injection of holes from region 31 into layer 38. Thus, this positive feedback process continues until the buildup of mobile charges in layer 38 and P-type region 40 causes the space charge layer at their blocked junction to collapse. A low impedance conducting path is formed thereby between electrode 44 and electrode 49.

In quadrant two operation, a positive voltage is applied to terminal 48, while a voltage more negative than that applied to terminal 43 is applied to terminal 46. Blocking junctions are formed between layer 38 and regions 31 and 37, and between regions 40 and 41. The highly negative voltage at terminal 46 causes region 34 to inject electrons into region 31, where the electrons diffuse toward the blocked junction with layer 38. The injected electrons that are collected lower the potential of layer 38 relative to P-type region 39, thereby causing P-type carriers to be injected from region 39 into layer 38. The injected carriers diffuse through layer 38 toward the blocked junction with region 31, and those collected raise the potential of region 31 with respect to N-type region 34. Thus, electrons are again caused to be injected by region 34 into region 31 where they diffuse toward the blocked junction with layer 38 as before described. The positive feedback process continues until the buildup of mobile charges in region 31 and layer 38 causes the space charge layer at their junction to collapse, whereby a low impedance conducting path is formed between electrode 44 and electrode 42.

Figure 5:
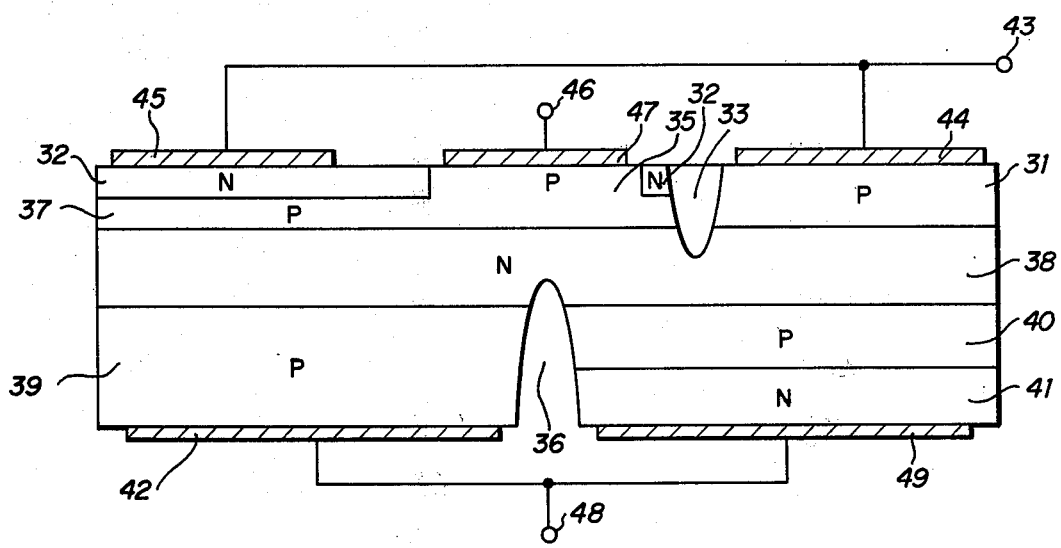

A sectional view of the switching device looking in a direction opposite to that of FIG. 4 is illustrated in FIG. 5, where like reference numbers represent like components and an outer surface region 35 is shown as a vertical extension of region 37. With terminal 43 assumed negative relative to terminals 46 and 48, first quadrant operation ensues and blocking junctions are formed between layer 38 and regions 31 and 37, and between regions 40 and 41. When a voltage positive relative to terminal 43 but less positive than terminal 48 is applied to the control signal terminal 46, electrons are injected by region 32 into region 37 and diffuse toward the blocking junction with layer 38. Thos injected electrons which are collected lower the potential of N-type layer 38 relative to P-type region 39. As a consequence, mobile P-type carriers are injected from region 39 into layer 38, and diffuse toward the junction between layer 38 and region 37. The holes collected at the junction raise the potential of P-type region 37 relative to N-type region 32 to cause further injection of electrons from region 32. This positive feedback process continues until the buildup of mobile charges in region 37 and layer 38 causes the space charge layer at their junction to collapse. A conducting path is formed thereby between electrode 45 and electrode 42.

Figure 6:
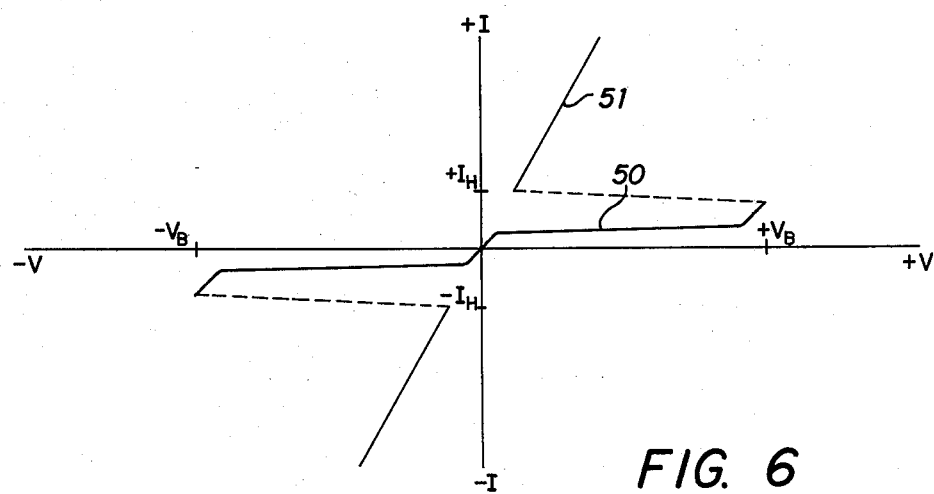
FIG. 6 is an I–V diagram of the operating characteristics of a symmetrical semiconductor switch embodying the invention.

In fourth quadrant operation, a negative voltage is applied to terminal 48, while a positive voltage is applied to terminal 43. The junctions between layer 38 and regions 39 and 40, and between regions 32 and 37 become reverse biased to form blocking junctions. When a voltage more positive than that applied to terminal 43 is applied to terminal 46, the junctions between regions 32 and 37 become forward biased, and electrons are injected by region 32 into region 37. The injected electrons diffuse toward the junction with layer 38 where the space charge layer is sufficient for the collection of minority carriers. Those injected electrons that are collected lower the potential of layer 38 relative to P-type regions 31 and 37 to cause the injection of holes from the regions into layer 38. The injected holes diffuse toward the blocked junction with region 40, and those collectd raise the potential of region 40 relative to N-type region 41. The difference in potential causes the injection of electrons from region 41 into region 40. The injected electrons diffuse toward the junction with layer 38, and those collected lower the potential of layer 38 relative to regions 31 and 37 to cause the further injection of holes from the regions into layer 38. The injected holes then diffuse toward the blocked junction with region 40 as before described. This positive feedback process continues until the buildup of mobile charges in region 40 and layer 38 causes the space charge layer at their junction to collapse and thereby form a low impedance path between electrode 44 and electrode 49. The conduction characteristics provided by the symmetrical four quadrant operation of the present switch device is illustrated further in the I–V diagram of FIG. 6, where $V_B$ indicates the breakover voltage and $I_H$ indicates the required holding current in the two directions of conduction. The I–V graph of the first quadrant illustrates forward conduction which can be provided by either two of the gating quadrant modes, while the I–V graph of the third quadrant illustrates the reverse conducting mode initiated by the other two gating quadrant modes. The symmetrical device of the present invention will remain in the conductive state due to any of the four quadrants of gating operation so long as the output current is greater than the holding current. In first quadrant operation, by way of example, where both the output current and applied voltage are positive, application of a voltage across the anodes with a zero gate bias results in a very slow increase in output current as indicated by curve portion 50.

When the applied voltage reaches the breakover voltage $V_B$, the device becomes conducting and the output current increases sharply as shown by the curved portion 51.

Figure 7:
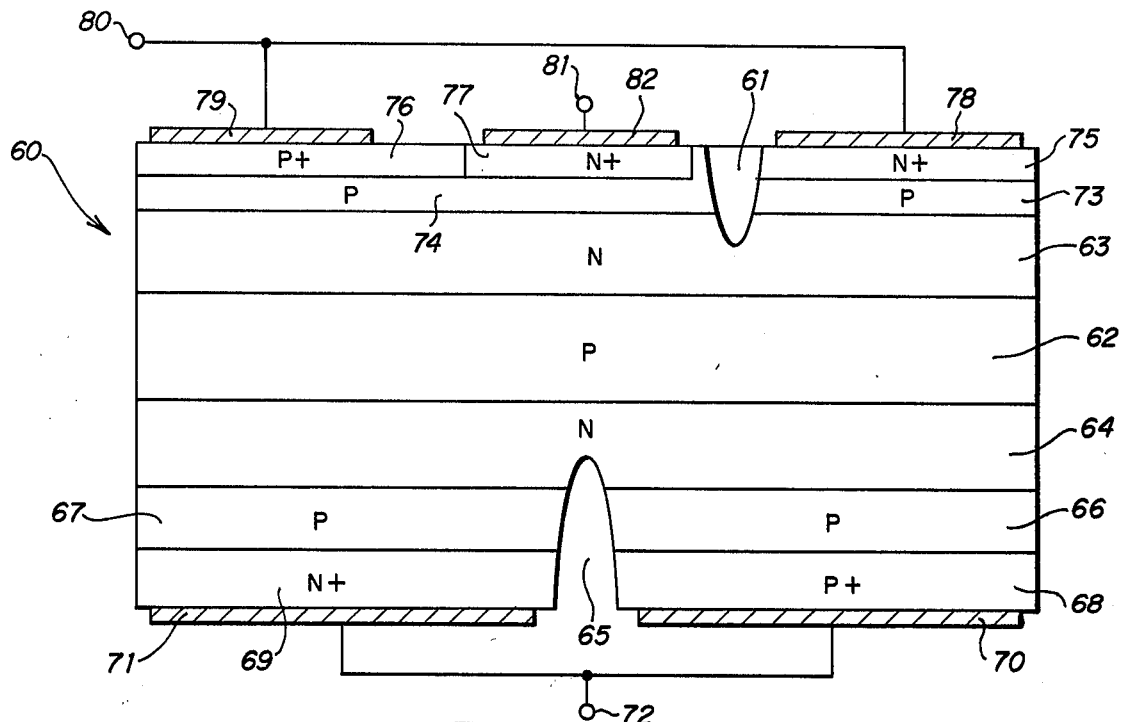
FIG. 7 is a diagrammatic sectional view of a seven layer switching device embodying the invention.

A sectional view comparable to that of FIG. 4 but involving a seven layer symmetrical switching device employing the invention is illustrated in FIG. 7. It will of course be understood that a seven layer device may be constructed with opposite conductivity types than are shown in FIG. 7. FIG. 7 illustrates a semiconductor body 60 including a central P-type layer 62 interposed between intermediate N-type layers 63 and 64. Formed in contact with layer 64 on either side of a groove 65 are P-type regions 66 and 67. A heavily doped P-type region 68, designated hereafter as a P+ region, is formed in contact with region 66, while a heavily doped N-type region 69, hereafter referred to as an N+ region, is formed in contact with region 67. An electrode 70 in contact with P+ region 68 is connected in parallel with an electrode 71 in contact with N+ region 69 to form an anode terminal 72.

Formed in contact with layer 63 on either side of a groove 61 are P-type regions 73 and 74. An N+ region 75 is formed in contact with region 73, while a P+ region 76 and an adjacent N+ region 77 are formed in contact with region 74. An electrode 78 in contact with N+ region 75 is connected in parallel to an electrode 79 in contact with P+ region 76 to form a second anode terminal 80.

A control terminal or gate 81 is formed from an electrode 82 which is in contact with N+ region 77, and which is connected in parallel to an electrode (not shown) in contact with a P+ region diffused into region 73. In accordance with the invention, the electrodes of terminal 81 are electrically isolated and separated apart by groove 61. In addition, the surface areas of N+ region 77 and the opposing P+ region (not shown) diffused into region 73 overlap groove 65 to provide a four quadrant sensitivity control.

It has been found that the additional layers of semiconductor material further increase the voltage capacity of the device and improve the high temperature stability. The static $dV/dt$ characteristics also are improved since the capacitance is effectively split among more blocking junctions than are provided in the five layer embodiment. An improvement also is noted in the commutating $dV/dt$ characteristics.

As the seven layer device in all four I–V quadrants performs in a manner generally analogous to that before described in the operation of the five layer device of FIG. 4, taking into consideration the types of semiconductor materials utilized for the various layers, no further discussion is devoted to the operation theory therein.

Figure 8:
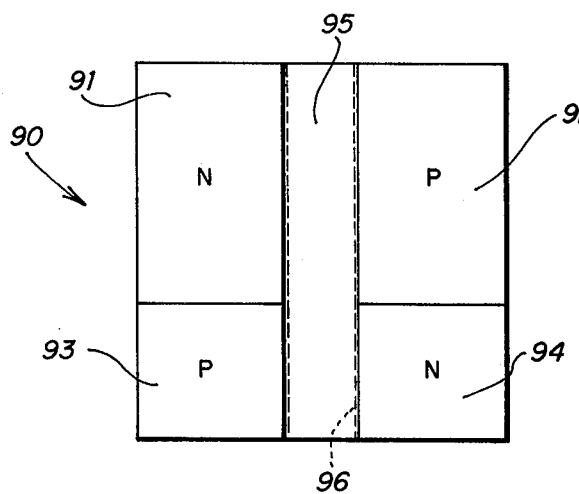
FIG. 8 is a top diagrammatic illustion of a semiconductor switching device having upper and lower surface grooves conforming to a bar geometry providing symmetrical operating characteristics in the first and third switching quadrants only.

In forming the non-linear groove patterns in the upper surfaces of the switching devices embodying the present invention, it is to be understood that other grooved configurations, generally referred to as bar geometry, are equally effective in varying the sensitivity of a switching device in the four quadrants of operation. For example, semiconductor body 90 as illustrated in FIG. 8 has an N-type region 91 and a P-type region 93 isolated from a P-type region 92 and an N-type region 94 by a groove 95. A groove 96 indicated by dotted lines in the figure extends through the lower surface of semiconductor body 90. Such a configuration provides a semiconductor switch which operates satisfactorily in only the first and third quadrants.

Figure 9:
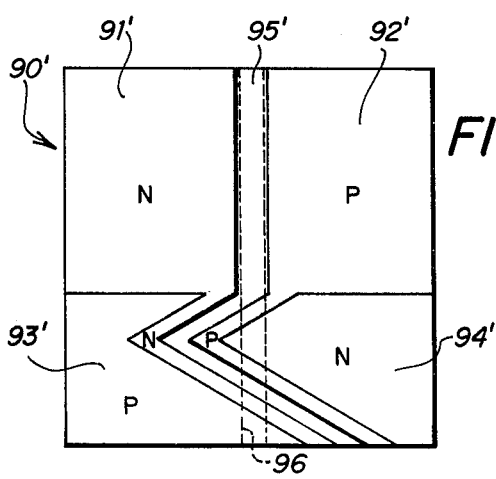
FIGS. 9 and 10 are top diagrammatic views of the device of FIG. 8 modified by grooves conforming to bar geometries in accordance with the invention.
Figure 10:
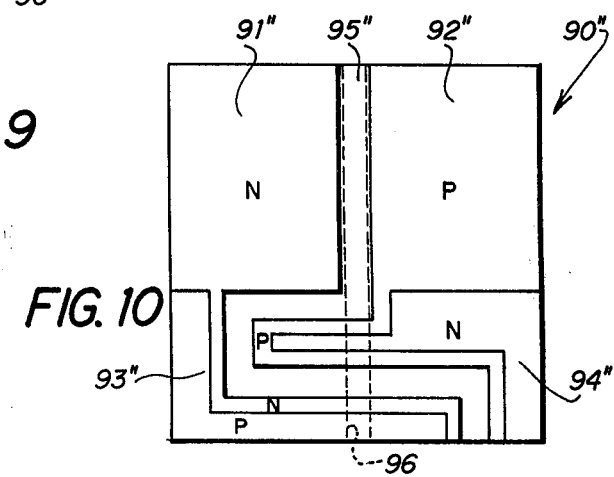

The operating characteristics in the second and fourth quadrants may be improved by resorting to the bar geometries illustrated in FIGS. 9 and 10 where like reference numbers represent like component parts, and the single and double prime numbers represent modifications to the semiconductor device of FIG. 8. It is seen that the bar geometries shown in both FIG. 9 and FIG. 10 provide an overlap of semiconductor regions on either side of bottom groove 96. Thus, conducting paths are formed through the semiconductor switching device without requiring the generation of substantial lateral currents.

More particularly, groove 95' of FIG. 9 is so configured as to provide an overlap of P-type region 93' and N-type region 94'. Similarly, the groove 95'' of FIG. 10 provides an overlap of P-type region 93'' and N-type region 94''.

In accordance with the invention, there are thus provided semiconductor switching devices having substantially eliminated lateral switching currents and symmetrical performance characteristics in four quadrants of operation. More particularly, symmetrical switching devices are provided comprising multiple layers of alternating semiconductor conductivity types. The lower surface of each device is dissected by a linear groove separating and electrically isolating electrodes in contact with different conductivity type regions to form an anode. In addition, the upper surface of the device is dissected by a groove conforming to bar geometries which provide for the separation and electrical isolation of not only electrodes forming a second anode, but also semiconductor regions of different conductivity types which are in contact with electrodes forming a control terminal and which overlap the upward projection of the lower surface groove.

Having described the invention in connection with certain specific embodiments thereof, it is to be understood that further modifications may now suggest themselves to those skilled in the art and it is intended to cover such modifications as fall within the scope of the appended claims.

What is claimed is:

1. A semiconductor switching device having symmetrical performance characteristics comprising:
   a. a semiconductor body formed from a plurality of semiconductor layers of alternating first and second conductivity types;
   b. at least three electrodes in contact with outer surfaces of said body;
   c. first means for physically and electrically isolating areas of one of said outer surfaces; and
   d. second means having segments which bisect a plane through said first means for physically and electrically isolating areas of a second of said outer surfaces so as to provide conduction of said device by the application of any of four gating quadrant combinations to said electrodes.

2. The combination as set forth in claim 1 wherein said plurality of layers numbers five, and wherein said first conductivity type comprises a P-type semiconductor material and said second conductivity type comprises an N-type semiconductor material.

3. The combination as set forth in claim 2 wherein said plurality of layers numbers seven, and wherein said first conductivity type comprises a P-type semiconductor material and said second conductivity type comprises and N-type semiconductor material.

4. The combination set forth in claim 1 wherein said first means comprises said body having a first groove extending through said one of said outer areas.

5. The combination set forth in claim 4 wherein said second means comprises said body having a second groove extending through said second of said outer areas and conforming to bar geometries rendering said switching device operable in four quadrants.

6. A semiconductor switch device having symmetrical performance characteristics in four switching quadrants comprising:
   a. a body of semiconductor material formed from a plurality of interleaved semiconductor layers of first and second conductivity types, and having grooves extending through two opposed outer surface layers of said body, planes which extend through said grooves bisecting one another;
   b. semiconductor regions of said first and second conductivity types diffused into said outer surface layers on either side of said grooves, with opposing regions of opposite conductivity types in an upper of said outer surface layers overlapping a projected path of a groove in a lower of said outer surface layers; and
   c. electrodes formed in contact with said outer surface layers and said regions.

7. The combination set forth in claim 6 wherein said semiconductor switch is comprised of five interleaved layers of said first and second conductivity types.

8. The combination set forth in claim 7 wherein said semiconductor switch is comprised of seven interleaved layers of said first and second conductivity types.

9. The combination set forth in claim 6 wherein said first conductivity type comprises a P-type semiconductor material and said second conductivity type comprises an N-type semiconductor material.

10. The combination set forth in claim 6 wherein said body has a first groove dissecting said lower of said outer surface layers, and physically and electrically isolating an area of said lower layer from a region of opposite conductivity type.

11. The combination set forth in claim 10 wherein said upper of said outer surface layers has a second groove extending through said upper layer and configured so as to separate and electrically isolate said opposing regions of opposite conductivity types, said second groove further separating and electrically isolating an area of said upper layer and an adjacent one of said opposing regions from remaining regions of said upper layer.

12. The combination set forth in claim 11 wherein said opposing regions are semicircular in shape and are bisected by said projected path to provide symmetrical conductance performance characteristic in any of four gating quadrants of operation.

13. The combination set forth in claim 11 wherein said opposing regions are semicircular in shape and extend less than hald their area across said projected path to favor first and third quadrant operation.

14. The combination set forth in claim 11 wherein said opposing regions extend more than half their area across said projected path to favor second and fourth quadrant operation.

15. The combination set forth in claim 11 wherein said second groove comprises a first linear segment parallel to said projected path, a first circular segment, a second linear segment at an angle with said first linear segment, a second circular segment, and a third linear segment colinear with said first linear segment.

16. The combination set forth in claim 11 wherein said second groove comprises a series of linear segments alternately parallel and at right angles to said projected path.

17. The combination set forth in claim 11 wherein said second groove comprises a linear segment parallel to said projected path followed by segments at an angle with said projected path.

18. The combination set forth in claim 11 wherein each of said opposing regions are in contact with one electrode of an electrode pair forming a control terminal.

19. The combination set forth in claim 16 wherein electrodes in contact with regions of opposite conductivity types are paired to form anode terminals.

20. In a semiconductor switch device having symmetrical switching characteristics and including a body of semiconductor material formed from numerous interleaved layers of opposite semiconductor conductivity types, with a plurality of regions of opposite and like semiconductor conductivity types formed into outer surface layers of the body, the combination which comprises:
 a. a lower of said outer surface layers having a first groove extending through said lower layer, and physically and electrically isolating an area of said lower layer from one of said plurality of regions of opposite conductivity type;
 b. an upper of said outer surface layers having a second groove extending through said upper layer, planes which extend through said first and second groove bisecting one another;
 c. two opposing regions of said plurality of regions diffused within said upper layer so as to overlap a projected path of said first groove, said two opposing regions being separated and electrically isolated by said second groove; and
 d. electrodes formed in contact with said outer surface layers and said plurality of regions.

21. The combination set forth in claim 20 wherein a pair of said electrodes in contact with said upped layer and a second of said plurality of regions form an anode.

22. The combination set forth in claim 20 wherein a pair of said electrodes in contact with said lower layer and a second of said plurality of regions form an anode.

23. A symmetrical semiconductor switching device sensitive to control in each of four switching quadrants of operation, comprising:
 a. a body of semiconductor material formed from a plurality of interleaved layers of first and second semiconductor conductivity types, and having first and second grooves respectively extending through an upper and a lower outer surface layer of said body;
 b. a pair of opposing regions of opposite semiconductor conductivity types formed in said upper outer surface layer on either side of said first groove and bisecting and overlapping a plane extending through said second groove; and
 c. electrodes formed in contact with said upper and said lower outer surface layers and with said pair of opposing regions.

* * * * *

UNITED STATES PATENT OFFICE
CERTIFICATE OF CORRECTION

Patent No. 3,972,014     Dated July 27, 1976

Inventor(s) Jearld L. Hutson

It is certified that error appears in the above-identified patent and that said Letters Patent are hereby corrected as shown below:

Column 1, line 30, after "Nos." delete "s8c"; line 31, "3,60,696" should read -- 3,360,696 --. Column 2, line 42, "illustion" should read -- illustration --; line 60, after "material" insert -- and --. Column 3, line 26, "bocy" should read - body --; line 30, "semicicular" should read -- semicircular --; line 47, delete "degree"; line 52, "33b°'" should read -- 33b' --; line 55, "34A'" should read -- 34a' --. Column 5, line 17, "Thos" should read -- Those --; line 47, "collectd" should read -- collected --. Column 8, line 65, "characteristic" should read -- characteristics --. Column 9, line 1, "hold" should read -- half --; line 25, "16" should read -- 6 --. Column 10, line 15, "upped" should read -- upper --.

Signed and Sealed this

Eighth Day of February 1977

[SEAL]

Attest:

RUTH C. MASON
Attesting Officer

C. MARSHALL DANN
Commissioner of Patents and Trademarks